United States Patent [19]
Lin et al.

[11] Patent Number: 6,037,622
[45] Date of Patent: Mar. 14, 2000

[54] CHARGE PUMP CIRCUITS FOR LOW SUPPLY VOLTAGES

[75] Inventors: Hongchin Lin, Taichung; Kai-Hsun Chang, Baan-Chyau; Shyh-Chyi Wong, Taichung, all of Taiwan

[73] Assignee: Winbond Electronics Corporation, Taiwan

[21] Appl. No.: 09/280,669

[22] Filed: Mar. 29, 1999

[51] Int. Cl.[7] .......................... H01L 27/108; H01L 29/76; H01L 29/94; H01L 31/119
[52] U.S. Cl. .......................... 257/299; 307/110; 327/390; 327/536; 327/537; 363/59; 363/60
[58] Field of Search .............................. 257/299; 327/536, 327/537, 390; 307/110; 363/59, 60

[56] References Cited

U.S. PATENT DOCUMENTS

| | | |
|---|---|---|
| 4,214,174 | 7/1980 | Dickson . |
| 4,701,637 | 10/1987 | Piro . |
| 4,739,191 | 4/1988 | Puar . |
| 4,935,644 | 6/1990 | Tsujimoto . |
| 4,962,512 | 10/1990 | Kiuchi . |
| 5,081,371 | 1/1992 | Wong . |
| 5,352,936 | 10/1994 | Allen . |
| 5,399,928 | 3/1995 | Lin et al. . |
| 5,524,266 | 6/1996 | Tedrow et al. . |
| 5,589,793 | 12/1996 | Kassapian ................................ 327/536 |
| 5,612,921 | 3/1997 | Chang et al. . |
| 5,642,072 | 6/1997 | Miyamoto et al. ...................... 327/535 |
| 5,754,476 | 5/1998 | Caser et al. ......................... 365/185.29 |

*Primary Examiner*—Ngân V. Ngô
*Attorney, Agent, or Firm*—Finnegan, Henderson, Farabow, Garrett & Dunner, L.L.P.

[57] ABSTRACT

A semiconductor integrated circuit includes a first charge pumping circuit connected to an input node. The first charge pump circuit includes a plurality of first driving transistors and charges an input voltage at the input node to a control voltage. A second charge pumping circuit includes a plurality of second driving transistors that each receive the control voltage from the first charge pump. The received control voltage controls the driving of the second transistors when charging an output node to an output voltage. To eliminate body effects, the semiconductor integrated circuit further includes a plurality of body transistors that connect the source and body terminals of the driving transistors.

21 Claims, 5 Drawing Sheets

CHARGE PUMP CIRCUITS FOR LOW SUPPLY VOLTAGES

BACKGROUND OF THE INVENTION

1. Field of the Invention

The present invention relates to charge pump circuits and methods and, more particularly, to charge pump circuits and methods for use with low supply voltages.

2. Description of the Related Art

To reduce power consumption and extend battery life, the integrated circuitry of many personal computers run at low voltage levels. While running at a low voltage solves many power consumption problems, certain computer functions require a high voltage. For example, electrically erasable programmable read only memories (EEPROMs) require a high voltage to alter or erase the stored data. When the available power supply cannot provide the high voltage, the memory device will typically include a charge pump circuit to boost the power supply voltage to the higher value.

FIG. 1 is a circuit diagram of a conventional charge pump circuit 100. As shown in FIG. 1, the charge pump circuit 100 includes n-type metal oxide semiconductor field effect transistors (MOSFETs) T1 to T5 and capacitors C1 to C4 and Co. Transistors T1 to T5 are connected with their source and drain terminals in series between a voltage supply Vs and an output terminal Vo. In addition, transistors T1 to T5 are configured as diodes by the gate terminal of each transistor being tied to its drain terminal, while each transistor's body terminal is connected to ground.

Capacitors C1 to C4 are each connected to one of two non-overlapping clock signals $\phi1$ and $\phi2$, provided by clock sources not shown. Specifically, clock signal $\phi1$ is connected to capacitors C1 and C3, while clock signal $\phi2$ is connected to capacitors C2 and C4. The other ends of capacitors C1 to C4 are connected to the source terminals of transistors T1 to T4, respectively. Capacitor Co, on the other hand, is connected between the source terminal of transistor T5 and ground. FIG. 2 is a timing diagram showing the waveforms of clock signals $\phi1$ and $\phi2$. As shown in FIG. 2, clock signals $\phi1$ and $\phi2$ are square wave signals, opposite in phase, and which vary between a low value of ground and a high value of Vs.

When clock signal $\phi1$ is low, transistor T1 will be turned on because its gate voltage will be substantially higher than its source voltage. As transistor T1 turns on, capacitor C1 charges to the value of Vs less a threshold drop Vt across transistor T1. Thereafter, when clock signal $\phi1$ rises, the voltage at the drain terminal of transistor T2 is boosted up to 2Vs–Vt by capacitor C1. This turns off transistor T1 and turns on transistor T2, causing capacitor C2 to charge to a value of 2Vs–2Vt. When clock signal $\phi1$ goes low again, the voltage at the drain terminal of transistor T3 is boosted to 3Vs–2Vt by capacitor C2, thereby turning on transistor T3. This, in turn, causes the voltage on capacitor C3 to rise to the level of 3Vs–3Vt.

This pattern of charging continues with a boosted output voltage Vo eventually appearing across capacitor Co at the output terminal. The voltage at the output terminal will ultimately approach a value represented by the equation $[(N+1)\times(Vs-Vt)]$, where N is the number of stages of charge pump circuit 100.

Charge pump circuit 100, however, suffers from a number of problems when used with a low supply voltage. For instance, although charge pump circuit 100 can achieve a high output voltage from a low supply voltage Vs by increasing the number of cascaded stages, this necessarily decreases the charging speed of circuit 100. In addition, the voltage output of charge pump circuit 100 is limited by what is known as body effect. This effect occurs because the transistor source terminals of circuit 100 cannot be tied to the body terminal since the source must be allowed to rise above the supply voltage Vs, as described above. The resulting large source-to-body voltage gives rise to a body effect, which causes the threshold voltage Vt to increase, and thereby decrease the value of Vo.

Therefore, it is desired to have a charge pump circuit that can provide large positive or negative output voltages when used with a low supply voltage.

SUMMARY OF THE INVENTION

Circuits consistent with the present invention provide large positive or negative output voltages when used with a low supply voltage. In addition, circuits and methods consistent with the invention are able to quickly charge the output to the desired level and reduce body effect.

To achieve these and other advantages, a semiconductor integrated circuit consistent with the present invention comprises a first charge pump circuit connected to an input node. The first charge pump circuit includes a plurality of first driving transistors and charges an input voltage at the input node to a control voltage. A second charge pump circuit includes a plurality of second driving transistors that each receive the control voltage from the first charge pump. The received control voltage controls the driving of the second transistors when charging an output node to an output voltage.

In an alternative embodiment, a semiconductor integrated circuit comprises a charge pump circuit for charging an output node to an output voltage. The charge pump circuit includes a plurality of driving transistors connected in series between an input node and the output node, with each of the driving transistors having a source terminal and a body terminal. The semiconductor integrated circuit further includes a plurality of body transistors that connect the source and body terminals of a corresponding one of the plurality of driving transistors.

Both the foregoing general description and the following detailed description are exemplary and are intended to provide further explanation of the invention as claimed.

BRIEF DESCRIPTION OF THE DRAWINGS

The accompanying drawings provide a further understanding of the invention and, together with the detailed description, explain the principles of the invention. In the drawings.

DETAILED DESCRIPTION

Embodiments of the present invention will now be described with reference to the accompanying drawings.

Figure 3:
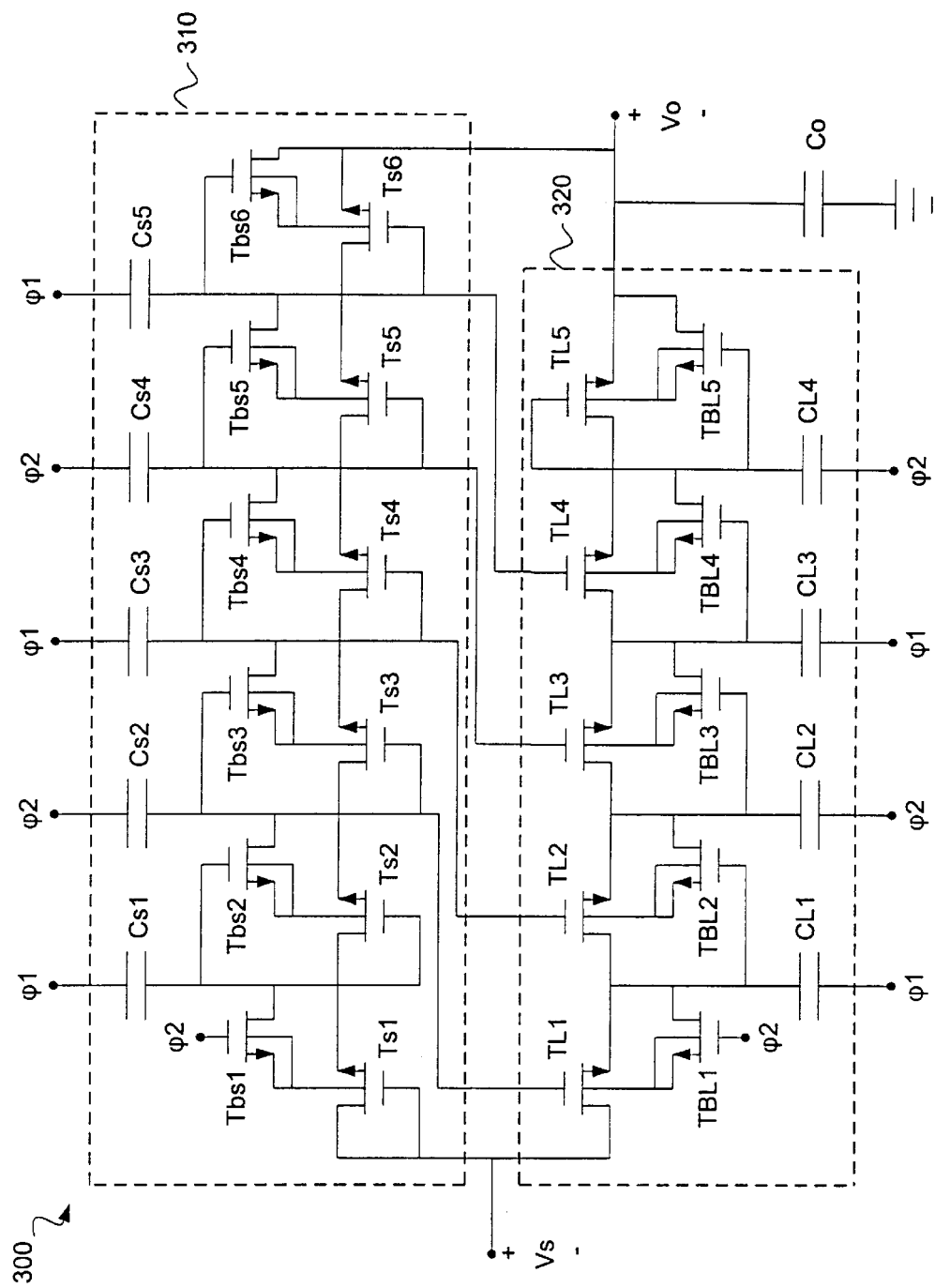
FIG. 3 is a diagram of a charge pump circuit consistent with the present invention.

FIG. 3 illustrates a charge pump circuit 300 consistent with the present invention, using n-type transistors. As shown in FIG. 3, charge pump circuit 300 includes a small pumping circuit 310 and a large pumping circuit 320. Charge pump circuit 300 receives a supply voltage Vs and outputs a pumped-up voltage Vo, measured across a capacitor Co connected between an output terminal and ground. While FIG. 3 shows a four-stage charge pump circuit 300, any number of stages may be used to pump supply voltage Vs to a desired output voltage Vo.

Small pumping circuit 310 includes transistors Ts1 to Ts6, capacitors Cs1 to Cs5, and transistors Tbs1 to Tbs6. Transistors Ts1 to Ts6 are connected in series by their source and drain terminals, with the drain terminal of transistor Ts1 connected to supply voltage Vs. In addition, the drain terminals of transistors Ts1 to Ts6 are each tied to its corresponding gate terminal. The source terminals of transistors Ts1 to Ts5 are connected to a first end of capacitors Cs1 to Cs5, respectively, while the source terminal of transistor Ts6 is connected to a first end of capacitor Co. The other ends of capacitors Cs1, Cs3 and Cs5 are connected to receive clock signal φ1, while the same other ends of capacitors Cs2 and Cs4 are connected to receive clock signal φ2.

Figure 2:
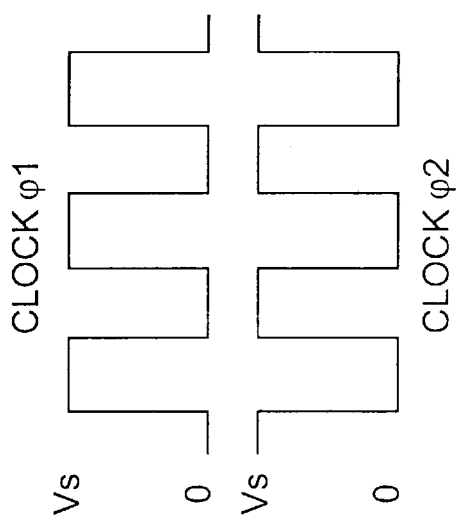
FIG. 2 is a timing diagram of clock signals used as input to a charge pump circuit.

Clock signals φ1 and φ2 are the same as those described above in reference to FIG. 2. However, charge pump circuits 300 consistent with the present invention may be used with clock signals that do not have mutually opposite phases. For example, charge pump circuit 300 may be used with clock signals φ1 and φ2 that divide their respective high or low states into unequal intervals. Further, while clock signals φ1 and φ2 preferably do not overlap, their rise and fall times may be unsynchronized.

Returning to FIG. 3, transistors Tbs1 to Tbs6 each reduce the body effect of small pumping circuit 310 by connecting the body and source terminals of a corresponding one of transistors Ts1 to Ts6. As shown in FIG. 3, the body and source terminals of transistor Tbs1 are connected to the body terminal of the corresponding transistor Ts1. The drain terminal of transistor Tbs1 is connected to the source terminal of its corresponding transistor Ts1. Transistors Tbs2 to Tbs6 are connected in the same manner to their corresponding transistors Ts2 to Ts6, respectively. Finally, the gate terminal of transistor Tbs1 is connected to clock signal φ2, while the gate terminals of transistors Tbs2 to Tbs6 are connected to the respective drain terminals of transistors Ts2 to Ts6.

Large pumping circuit 320 includes transistors TL1 to TL5, capacitors CL1 to CL4, and transistors TBL1 to TBL5. As shown in FIG. 3, the circuitry of large pumping circuit 320 mirrors that of small pumping circuit 310, with two notable exceptions. First, the gate terminals of transistors TL1 to TL4 are not connected to their drains, but, instead, are connected to the source terminals of transistors Ts2 to Ts5 of small pumping circuit 310. Second, the source terminal of transistor TL5 is connected to the first end of capacitor Co. As described above, the output voltage Vo represents the voltage across capacitor Co.

In a preferred embodiment of charge pump circuit 300, capacitors Cs1 to Cs5 each have a capacitance of 0.5 pF, capacitors CL1 to CL4 have a capacitance of 10 pF, and capacitor Co has a capacitance of 20 pF. The transistors of large pumping circuit 320 must be wide enough to drive the load current to capacitor Co. To this end, transistors TL1 to TL5 preferably have a channel width of 100 μm, while the widths of transistors Ts1 to Ts6 are each preferably 2 μm. The width of transistors Tbs1 to Tbs6 and TBL1 to TBL5 are also preferably 2 μm, but they may have smaller widths. The channel length of all of the transistors is preferably 0.6 μm.

Figure 1:
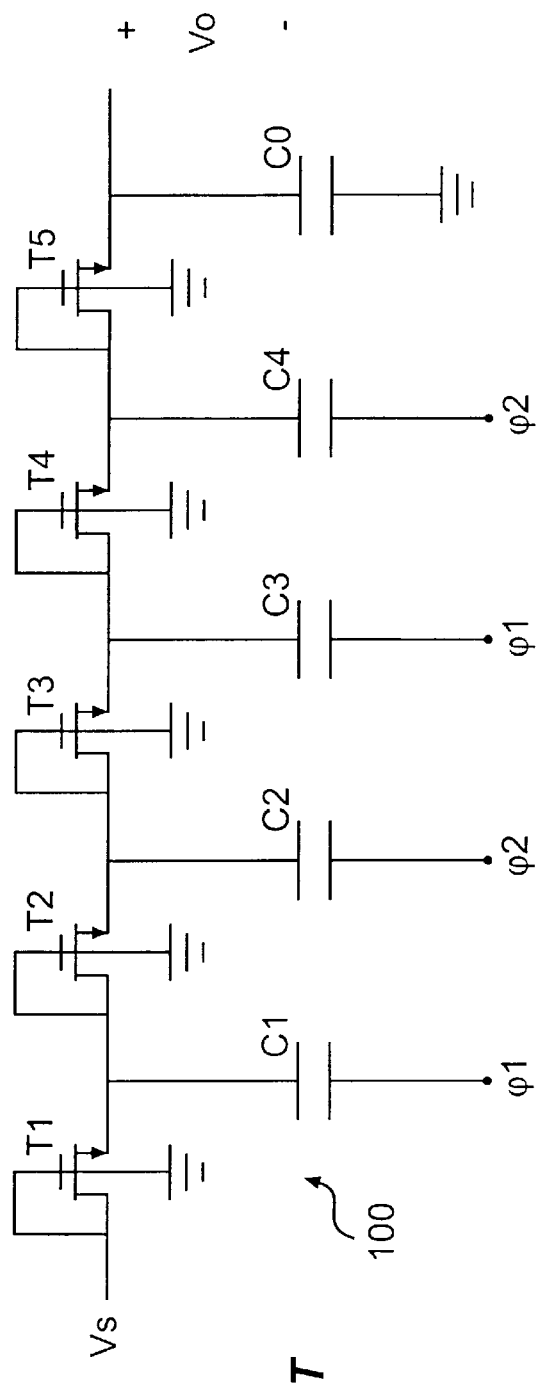
FIG. 1 is a diagram of a conventional charge pump circuit.

The operation of charge pump circuit 300 consistent with the invention will now be described with reference to FIG. 3. The operation of small pumping circuit 310 is similar to that described above in reference to FIG. 1. In particular, when clock signal φ1 is low, transistor Ts1 will be turned on and the voltage at the source to terminal of transistor Ts1 will be equal to the supply voltage Vs less the transistor's threshold voltage Vt. Thereafter, when clock signal φ1 rises, the voltage at this source terminal is boosted up to 2Vs−Vt by capacitor Cs1. This turns off transistor Ts1 and turns on transistor Ts2, causing capacitor Cs2 to charge to a value of 2Vs−2Vt. When clock signal φ2 rises, the voltage at the source terminal of transistor Ts2 is boosted to 3Vs−2Vt by capacitor Cs2, thereby turning on transistor Ts3. This, in turn, causes the voltage at the source terminal of transistor Ts3 to rise to the level of 3Vs−3Vt. In this manner, the voltages at the source terminals of transistors Ts1 to Ts6 are increased in synchronism with the clock signals φ1 and φ2.

Transistors Tbs1 to Tbs6 decrease the body effect of small pumping circuit 310 by connecting together the source and body terminals of transistors Ts1 to Ts6, respectively. Clock signals φ1 and φ2 control the operation of transistors Tbs1 to Tbs6 such that each is turned on when the corresponding one of transistors Ts1 to Ts6 is turned on. In particular, transistors Tbs1, Tbs3, and Tbs5 will be turned on when clock signal φ2 is high, while transistors Tbs2, Tbs4, and Tbs6 will be turned on when clock signal φ1 is high. Therefore, the threshold voltage Vt of transistors Ts1 to Ts6 will each be lower due to the reduction in body effect, thereby allowing voltage Vo to charge to a higher value.

Transistors Ts6 and Tbs6 prevent charge from pumping backwards when current consumption by the external circuitry causes the output voltage Vo to decrease. When the output voltage Vo falls to a lower value, the gate-to-source voltage of transistors TL1 to TL5 increases, causing these transistors to turn on. This, in turn, causes the voltages at the gates of transistors TBL2 to TBL5 to decrease, thereby reducing the efficiency of charge pump circuit 300. To prevent transistors TL1 to TL4 from erroneously turning on, their gate voltages must decrease at the same time the output voltage Vo decreases. To this end, transistors Ts6 and Tbs6 are connected to the output voltage Vo, such that they can pull the source terminals of transistors Ts2 to Ts5 (i.e., the gate voltages of transistors TL1 to TL4) to a lower value when Vo decreases.

The operation of large pumping circuit 320 is similar to that of small pumping circuit 310, with the exception that circuit 320 drives a larger amount of current due to the larger transistors TL1 to TL5. Further, the gate terminals of transistors TL1 to TL4 receive a pumped-up voltage from a corresponding source terminal of transistors Ts2 to Ts5, respectively, of small pumping circuit 310. Because more charge is pumped by each capacitor CL1 to CL4 as it becomes closer to output capacitor Co, a greater amount of gate voltage is supplied to transistors TL1 to TL4 the closer they are to the output. For example, the voltage supplied to the gate terminal of transistor TL4 will be greater than that supplied to the gate terminal of transistor TL1. The higher gate voltage supplied to transistors TL1 to TL4 causes these transistors to be turned on "harder" (i.e., greater drain-to-source current) than if their gate voltage was connected to drain. When transistors TL1 to TL4 turn on "harder," they are able to conduct more current and thereby allow capacitors CL1 to CL4 to charge to higher voltages more quickly.

Transistors TBL1 to TBL5 decrease the body effect of large pumping circuit 320 by connecting together the source and body terminals of transistors TL1 to TL5, respectively. Clock signals φ1 and φ2 control the operation of transistors TBL1 to TBL5 such that each is turned on when the corresponding one of transistors TL1 to TL5 is turned on. In particular, transistors TBL1, TBL3 and TBL5 will be turned on when clock signal φ2 is high, while TBL2 and TBL4 will be turned on when clock signal φ1 is high. Therefore, the threshold voltage Vt of transistors TL1 to TL5 will each be lower due to the reduction in body effect, thereby allowing voltage Vo to charge to a higher value.

Figure 4:
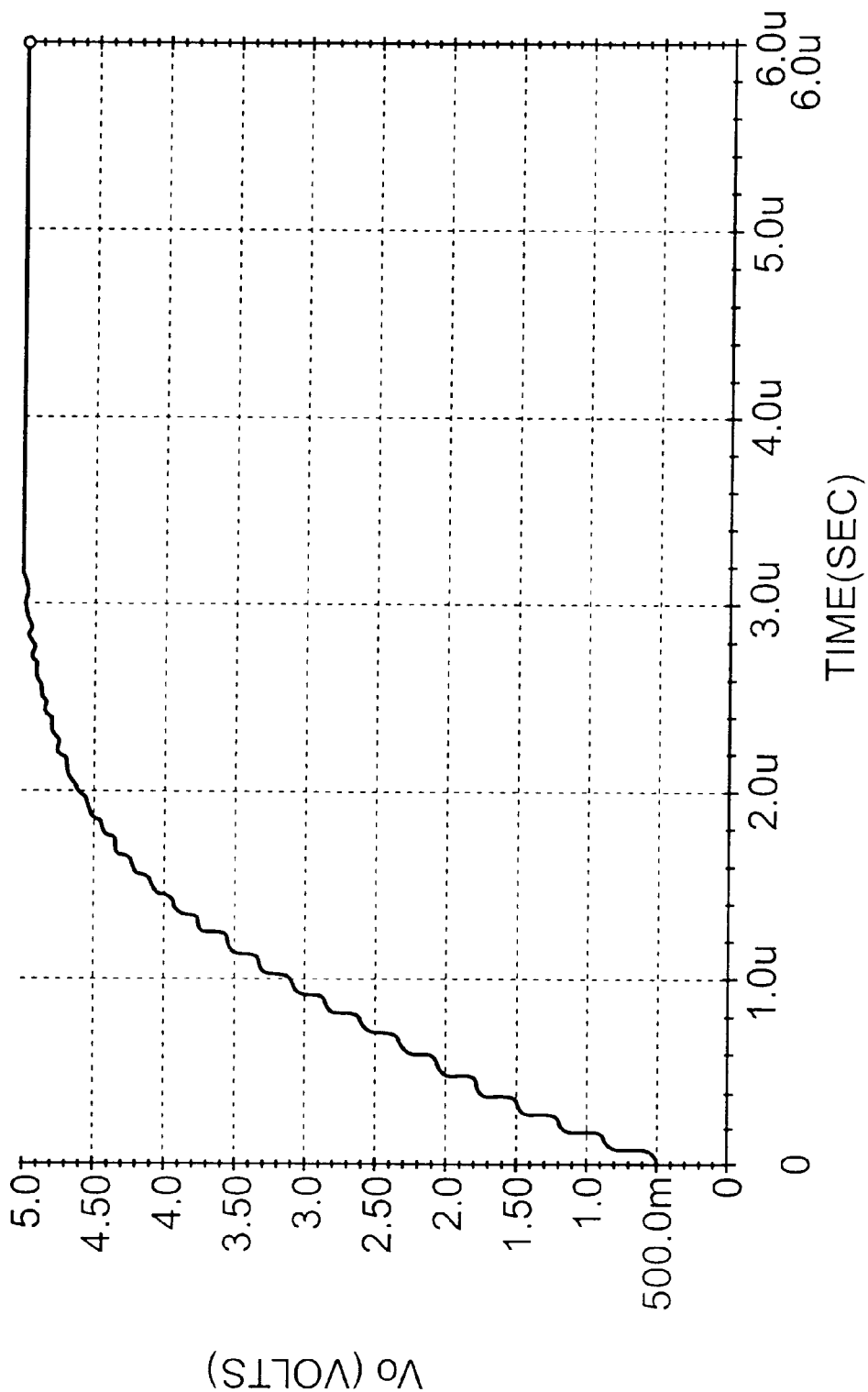
FIG. 4 is a graph showing the simulated output of the charge pump circuit of FIG. 3.

FIG. 4 is a graph showing a simulated output of charge pump circuit 300, where Vs is 1.5 volts, Vt is about 0.8 volts, the clock frequency (i.e., the frequency of clock signals φ1 and φ2) is 10 MHZ, and the values for the capacitors and transistors are those given above. As shown in FIG. 4, charge pump circuit 300 pumps the output voltage Vo to 90% of the steady state value (5 volts) in less than 2 μseconds. Thus, charge pump circuit 300 can pump output voltage Vo to a high value in nearly 20 clock cycles, while using a relatively low supply voltage Vs.

In charge pump circuits 300 consistent with the invention, small pumping circuit 310 and large pumping circuit 320 preferably use n-type MOSFET transistors. However, other types of semiconductor devices may be used for the transistors. In addition, the n-type transistors of charge pump circuit 300 are preferably fabricated using p-well technology, as known to those skilled in the art.

Figure 5:
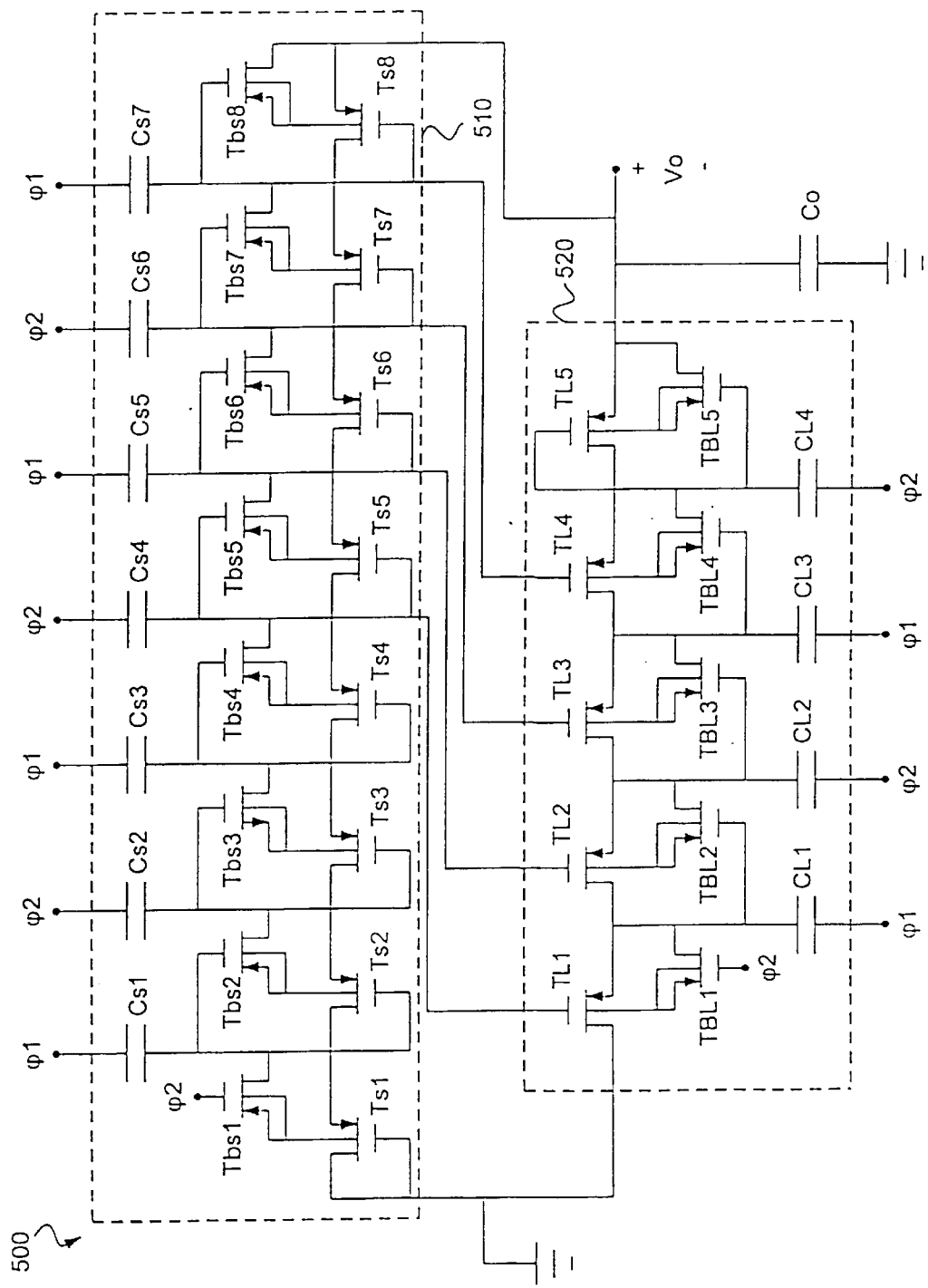
FIG. 5 is a diagram of an alternative embodiment of a charge pump circuit consistent with the present invention.

FIG. 5 illustrates a charge pump circuit 500 consistent with the present invention, using p-type transistors. Like charge pump circuit 300 of FIG. 3, charge pump circuit 500 includes a small pumping circuit 510 and a large pumping circuit 520. Charge pump circuit 500, however, instead of being connected to supply voltage Vs, is connected to ground. As shown in FIG. 5, small pumping circuit 510 also includes two more stages since Vt for the p-type transistors is different than that for the n-type transistors used in the embodiment of FIG. 3.

The p-type charge pump circuit 500 operates in the same manner as the n-type charge pump circuit 300 except that all voltages and currents are reversed. Thus, large pumping circuit 520 pumps positive charge carriers in the direction from capacitor Co to capacitor CL1. When clock signal φ1 is high and clock signal φ2 is low, transistor TL1 will be turned on due to a low gate voltage provided by small pumping circuit 510. Positive charge will then flow from capacitor CL1 to ground, via transistor TL1. Thereafter, when clock signal φ1 goes low and clock signal φ2 rises, transistor TL2 turns on, while transistors TL1 and TL3 are off, and positive charge on capacitor CL2 will be pumped to capacitor CL1. In this manner, the voltages at the source terminals of transistors TL1 to TL5 are decreased in synchronism with the clock signals φ1 and φ2, such that a pumped-up negative voltage is generated at Vo.

In a preferred embodiment of charge pump circuit 500, capacitors Cs1 to Cs7 each have a capacitance of 0.5 pF, capacitors CL1 to CL4 each have a capacitance of 10 pF, and capacitor Co has a capacitance of 20 pF. The transistors of large pumping circuit 520 must be wide enough to drive the positive charge to the ground terminal. To this end, transistors TL1 to TL5 each preferably have a channel width of 100 μm, while the widths of transistors Ts1 to Ts8, Tbs1 to Ths8, and TBL1 to TBL5 are each preferably 2 μm. The channel length of all of the transistors is preferably 0.6 μm. Finally, the p-type transistors of charge pump circuit 500 are preferably fabricated using n-well technology, as known to those skilled in the art.

Figure 6:
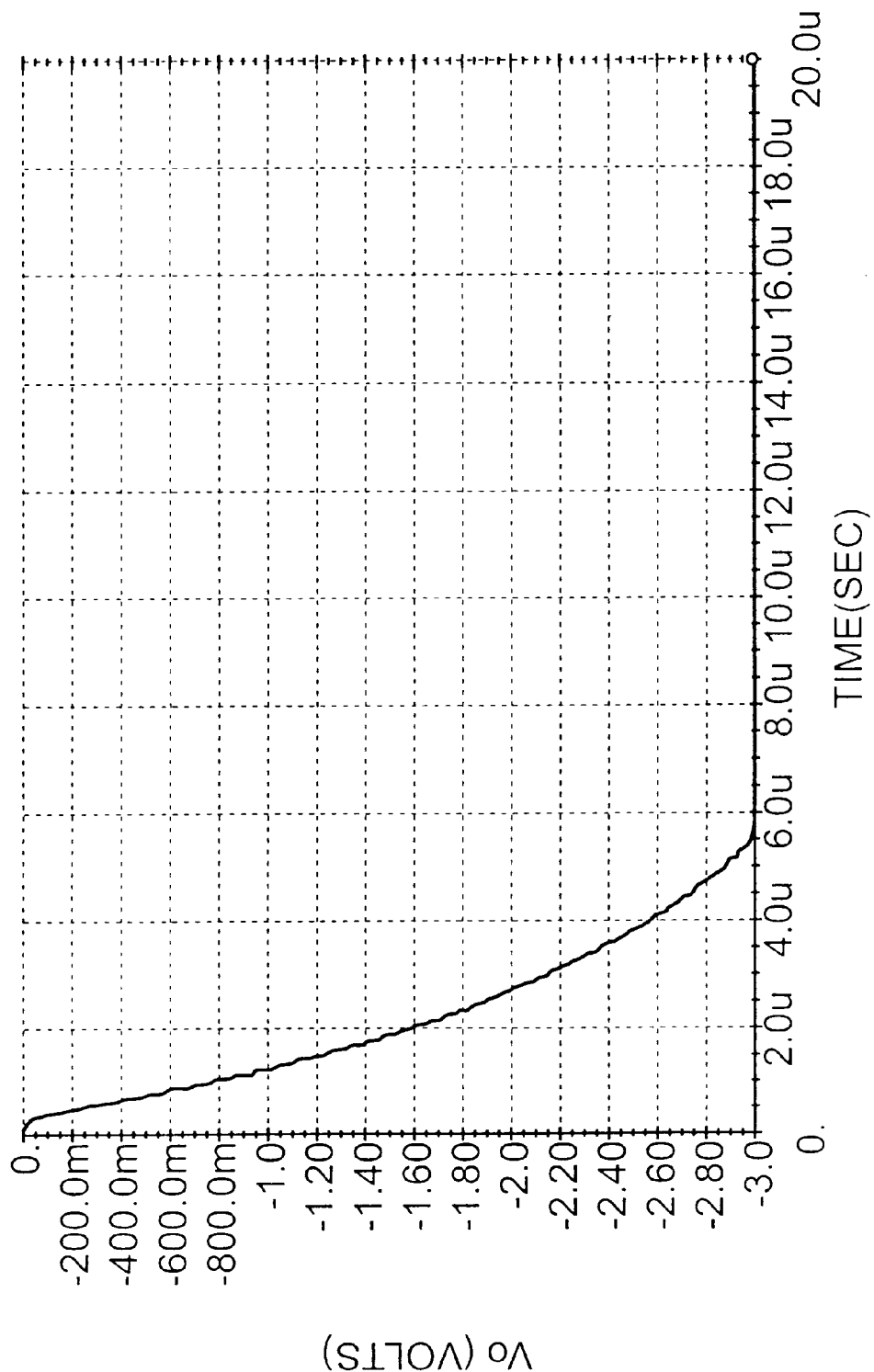
FIG. 6 is a graph showing the simulated output of the charge pump circuit of FIG. 5.

FIG. 6 is a graph showing a simulated output of charge pump circuit 500, where Vs is 1.5 volts, Vt is about –0.98 volts, the clock frequency is 10 MHZ, and the values for the capacitors and transistors are those given above. As shown in FIG. 6, charge pump circuit 500 pumps the output voltage Vo to 90% of the final steady state value (3 volts) in approximately 4.7 μseconds. Thus, charge pump circuit 500 can pump output voltage Vo to a highly negative value in nearly 47 clock cycles. Charge pump circuit 500 has a slower pumping speed than that of charge pump circuit 300 due to the lower current carrying capability of the p-type transistors. Further, because the supply voltage Vs is equal to ground in FIG. 5 and because Vt for the p-type transistors is higher than that for the n-type transistors, charge pump circuit 500 cannot pump Vo to the same magnitude as charge pump circuit 300 of FIG. 3.

It will be apparent to those skilled in the art that various modifications and variations can be made to the system and method of the present invention without departing from the spirit or scope of the invention. The present invention covers the modifications and variations of this invention provided they come within the scope of the appended claims and their equivalents.

What is claimed is:

1. A semiconductor integrated circuit for charging an output node to an output voltage, the circuit comprising:
   a first charge pump circuit connected between an input node and the output node and including a plurality of first driving transistors, and for charging an input voltage at the input node to a control voltage; and
   a second charge pump circuit including a plurality of second driving transistors that each receive the control voltage from the first charge pump circuit to control the driving of the second transistors when charging the output node to the output voltage.

2. A semiconductor integrated circuit for charging an output node to an output voltage, the circuit comprising:
   a first charge pump circuit connected to an input node and including a plurality of first driving transistors, and for charging an input voltage at the input node to a control voltage, the first driving transistors each having a source terminal and a body terminal; and
   a second charge pump circuit including a plurality of second driving transistors that each receive the control voltage from the first charge pump to control the driving of the second transistors when charging the output node to the output voltage;
   wherein the first charge pump circuit further includes a plurality of first body transistors each for connecting the source and body terminals of a corresponding one of the plurality of first driving transistors.

3. The circuit of claim 2, wherein the plurality of first driving transistors are switched on according to the state of a clock signal, and wherein each of the plurality of first body transistors is switched on only when the corresponding one of the plurality of first driving transistors is switched on by the clock signal.

4. The circuit of claim 1, wherein the second driving transistors each have a source terminal and a body terminal, and wherein the second charge pump circuit further includes:
   a plurality of second body transistors each for connecting the source and body terminals of a corresponding one the plurality of second driving transistors.

5. The circuit of claim 4, wherein the plurality of second driving transistors are switched on according to the state of a clock signal, and wherein each of the plurality of second body transistors is switched on only when the corresponding one of the plurality of second driving transistors is switched on by the clock signal.

6. The circuit of claim 1, wherein:
the plurality of first driving transistors of the first charge pump circuit are connected in series to form voltage control nodes between corresponding serially connected first driving transistors, selected ones of the voltage control nodes each outputting a control voltage; and
the plurality of second driving transistors of the second charge pump circuit are connected in series such that a gate terminal of selected ones of the plurality of second driving transistors receive one of the control voltages from a corresponding voltage control node of the first charge pump circuit.

7. The circuit of claim 6, wherein the number of first driving transistors is greater than the number of second driving transistors such that the first charge pumping circuit charges the control voltages to higher voltage values.

8. The circuit of claim 6, wherein a source terminal of a last transistor of the plurality of serially connected first driving transistors forms a last voltage control node that outputs a last control voltage, and wherein a gate terminal of one of the plurality of second driving transistors receives the last control voltage.

9. The circuit of claim 6, wherein each of the plurality of first driving transistors further includes a drain terminal and a source terminal, and wherein the first charge pumping circuit further includes:
a plurality of capacitors corresponding to the plurality of first driving transistors and providing a clock signal to the voltage control node corresponding to each first driving transistor, wherein adjacent capacitors alternate between receiving a first clock signal having a first phase and a second clock signal having a second phase that is opposite the first phase.

10. The circuit of claim 9, wherein the gate terminal of each of the plurality of first driving transistors is connected to its drain terminal.

11. The circuit of claim 6, wherein each of the plurality of second driving transistors includes a gate terminal, a drain terminal, and a source terminal, and wherein the second charge pump circuit further includes:
a plurality of capacitors corresponding to a subset of the plurality of second driving transistors and providing a clock signal to the source terminal of each transistor in the subset of the plurality of second driving transistors, wherein adjacent capacitors alternate between receiving a first clock signal having a first phase and a second clock signal having a second phase that is opposite the first phase.

12. The circuit of claim 1, wherein the first driving transistors and the second driving transistors are n-type transistors.

13. The circuit of claim 12, wherein the input node is connected to a supply voltage and the output voltage at the output node is charged to a high positive value.

14. The circuit of claim 1, wherein the first driving transistors and the second driving transistors are p-type transistors.

15. The circuit of claim 14, wherein the input node is connected to ground and the output voltage and the output node is charged to a negative value.

16. The circuit of claim 1, wherein the first driving transistors and the second driving transistors are MOSFETs.

17. The circuit of claim 1, wherein the first and second driving transistors are formed in an n-well or a p-well to insulate the first and second driving transistors from a main substrate of the semiconductor integrated circuit.

18. A semiconductor integrated circuit for charging an output node to an output voltage, the circuit comprising:
a charge pump circuit, including a plurality of driving transistors connected in series between an input node and the output node, and for charging the output node to the output voltage, wherein the plurality of driving transistors include a source terminal and a body terminal; and
a plurality of body transistors each for connecting the source and body terminals of a corresponding one the plurality of driving transistors.

19. The circuit of claim 18, wherein the plurality of driving transistors are switched on according to the state of a clock signal, and wherein each of the plurality of body transistors is switched on only when the corresponding one of the plurality of driving transistors is switched on by the clock signal.

20. The circuit of claim 18, wherein voltage nodes are formed between each serially connected driving transistor, and wherein the charge pump circuit further includes:
a plurality of capacitors corresponding to the plurality of driving transistors and providing a clock signal to the voltage node corresponding to each driving transistor, wherein adjacent capacitors alternate between receiving a first clock signal having a first phase and a second clock signal having a second phase that is opposite the first phase.

21. The circuit of claim 18, wherein the driving transistors and the body transistors are formed in an n-well or p-well to insulate the driving transistors and the body transistors from a main substrate of the semiconductor integrated circuit.

* * * * *